United States Patent

Sasaki et al.

[11] Patent Number: 6,051,157
[45] Date of Patent: Apr. 18, 2000

[54] PIEZOELECTRIC CERAMIC COMPOSITION

[75] Inventors: Satoshi Sasaki, Akita; Masaru Nanao, Chiba, both of Japan

[73] Assignee: TDK Corporation, Tokyo, Japan

[21] Appl. No.: 09/204,161

[22] Filed: Dec. 3, 1998

[30] Foreign Application Priority Data

Dec. 9, 1997 [JP] Japan ................... 9-338655

[51] Int. Cl.[7] .................. C04B 35/491; C04B 35/497
[52] U.S. Cl. .................. 252/62.9 PZ; 501/134
[58] Field of Search .............. 501/134; 252/62.9 PZ

[56] References Cited

U.S. PATENT DOCUMENTS 4,169,803 10/1979 Tanaka et al. ............. 252/62.9 PZ

FOREIGN PATENT DOCUMENTS

| | | |
|---|---|---|
| 54-53296 | 4/1979 | Japan . |
| 4-224168 | 8/1992 | Japan . |
| 5-139829 | 6/1993 | Japan . |
| 10-120463 | 5/1998 | Japan . |

Primary Examiner—C. Melissa Koslow
Attorney, Agent, or Firm—Oblon, Spivak, McClelland, Maier & Neustadt, P.C.

[57] ABSTRACT

A piezoelectric ceramic composition which contains a main component represented by the general formula of $x(Pb_2Me_2O_7)_{1/2} \cdot (1-x)[Pb(Zr_{1-y}Ti_y)O_3]$ in which x and y are numerical values satisfying the relations $0.01 \leq x \leq 0.05$ and $0.40 \leq y \leq 0.55$, and Me is at least one of Sb, Nb and Ta. In the component, 0.1 to 0.8% by weight of Cr calculated in terms of chrome oxide and 0.01 to 0.1% by weight of Si calculated in terms of silicon oxide with respect to the weight of 1 mol of the main component are added as subsidiary components.

5 Claims, 1 Drawing Sheet

FIGURE
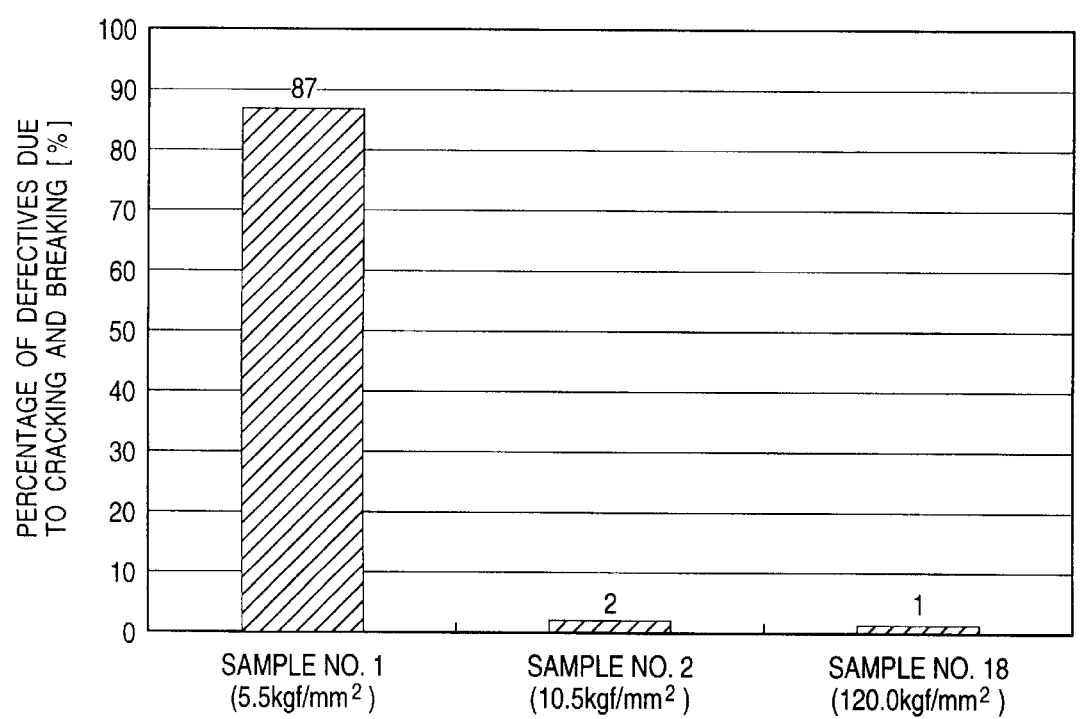

PIEZOELECTRIC CERAMIC COMPOSITION

BACKGROUND OF THE INVENTION

1. Field of the Invention

The present invention relates to a piezoelectric ceramic composition for use in a piezoelectric sensor, a piezoelectric buzzer, a piezoelectric actuator, a ceramic oscillator, a ceramic filter, or the like, and particularly to a piezoelectric ceramic composition adapted to a piezoelectric element for use in a vibration detecting piezoelectric sensor.

2. Description of the Related Art

A piezoelectric ceramic composition for use to constitute a piezoelectric sensor, especially, to constitute a vibration detecting piezoelectric sensor is required to have a small mechanical quality coefficient (Qm) (for example, not larger than 200) as its characteristic in order to detect objective vibration stably without being affected by noise.

In order to obtain high sensitivity of the sensor, it is preferable to select the relative dielectric constant E of the piezoelectric ceramic composition to be as large as possible (for example, not smaller than 1200) and the electromechanical coupling factor k31 of stretching vibration in a long side direction in a piezoelectric vibration mode to be high (for example, not lower than 35%).

Further, in the piezoelectric ceramic composition for use in a vibration detecting sensor, in order to enhance sensor sensitivity, a piezoelectric ceramic composition element is required to have large strength (for example, not smaller than 10 kgf/mm$^2$) because the element is required to be thin (for example, 60 to 100 $\mu$m).

On the other hand, high-density mounting of electronic parts onto a board has been made progress with the advance in the reduction in size and thickness of electronic appliances in recent years. Also as vibration detecting sensors, surface mounting type sensors are used mainly. Surface mounting type electronic parts must be excellent in heat resistance because the parts are exposed to a temperature of about 250° C. in a reflow furnace when the parts are mounted onto a board. That is, in order to obtain stable sensor sensitivity, it is preferable that the deterioration of piezoelectric characteristic after surface mounting is little.

It is heretofore known that a lead zirconate titanate type composition is suitable as a piezoelectric ceramic composition for use in a ceramic oscillator or a ceramic filter. Various improvements have been proposed in accordance with the purpose of use thereof.

For example, there have been proposed lead zirconate titanate type compositions which are hardened (sintered) by addition of $MnO_2$, $Cr_2O_3$, or the like, to the compositions; lead zirconate titanate type compositions which are improved in piezoelectric characteristic by solid solution of complex perowskite type compounds such as $Pb(Ni_{1/2}Nb_{2/3})O_3$, $Pb(Mg_{1/2}Nb_{2/3})O_3$, or the like, as a third component in the compositions and further hardened by addition of $MnO_2$, $Cr_2O_3$, or the like, to the compositions; and compositions obtained by replacing a part of Pb by Ba, Sr or Ca in order to improve the temperature characteristic of resonant frequency fr in the above-mentioned compositions.

Further, Unexamined Japanese Patent Publication No. Hei. 10-120463 discloses a piezoelectric ceramic composition small in mechanical quality coefficient and excellent in heat resistance.

A conventionally known piezoelectric ceramic composition low in mechanical quality coefficient Qm has a problem that the Curie temperature Tc is low (Tc<200° C.) because the composition only aims at increasing both the relative dielectric constant and the electromechanical coupling factor as represented by piezoelectric ceramics for use in an actuator.

Further, a composition having a Curie temperature Tc of about 300° C. and a small mechanical quality coefficient Qm has a problem that the heat resistance of the element is poor and the change with time of resonant frequency fr (the change of resonant frequency with respect to time) is large.

Some piezoelectric ceramic compositions are high in Curie temperature Tc and relatively good in heat resistance among the conventional piezoelectric ceramic compositions which are hardened by addition of $MnO_2$, $Cr_2O_3$, or the like, to $PbTiO_3$—$PbZrO_3$ type materials and the conventional piezoelectric ceramic compositions which are improved in piezoelectric characteristic by solid solution of complex perowskite type compounds such as $Pb(Ni_{1/2}Nb_{2/3})O_3$, $Pb(Mg_{1/2}Nb_{2/3})O_3$, or the like, as a third component in $PbTiO_3$—$PbZrO_3$ type materials and further hardened by addition of $MnO_2$, $Cr_2O_3$, or the like, to the materials. In those cases, however, there is a problem that the mechanical quality coefficient Qm is large (for example, Qm>200). It was difficult to configure a product as a target of the present invention.

Further, the piezoelectric ceramic composition disclosed in Unexamined Japanese Patent Publication No. Hei. 10-120463 is a piezoelectric ceramic composition which is small in mechanical quality coefficient Qm and excellent in heat resistance. The composition is, however, inferior in element strength, and it is difficult to produce an element which has a thickness not larger than 100 $\mu$m and which can be applied to a product as a target of the present invention.

SUMMARY OF THE INVENTION

In order to solve those problems, it is an object of the present invention to provide a piezoelectric ceramic composition which is small in mechanical quality coefficient Qm, high in electromechanical coupling factor k31 of stretching vibration in a longitudinal direction, large in relative dielectric constant $\epsilon$, excellent in heat resistance, little in deterioration of piezoelectric characteristic after the passage of the composition through a reflow furnace, and excellent in element strength.

A piezoelectric ceramic composition which contains a main component represented by the general formula of $x(Pb_2Me_2O_7)_{1/2} \cdot (1-x)[Pb(Zr_{1-y}Ti_y)O_3]$ in which x and y are numerical values satisfying the relations $0.01 \leq x \leq 0.05$ and $0.40 \leq y \leq 0.55$, and Me is at least one of Sb, Nb and Ta. In the component, 0.1 to 0.8% by weight of Cr calculated in terms of chrome oxide and 0.01 to 0.1% by weight of Si calculated in terms of silicon oxide with respect to the weight of 1 mol of the main component are added as subsidiary components.

BRIEF DESCRIPTION OF THE DRAWINGS

In the accompanying drawings:

FIG. 1 is a graph for explaining the percentage of defectives caused by cracking or breaking of elements at the time of manufacturing the products.

DETAILED DESCRIPTION OF THE INVENTION

Detailed description of the present invention will be described as follows.

The present invention provides a piezoelectric ceramic composition which contains a main component represented by the general formula of $x(Pb_2Me_2O_7)_{1/2} \cdot (1-X)[Pb(Zr_{1-y}Ti_y)O_3]$. In the formula, x and y are numerical values satisfying the relations $0.01 \leq x \leq 0.05$ and $0.40 \leq y \leq 0.55$. Me is at least one of Sb, Nb and Ta. Further, 0.1 to 0.8% by weight of Cr calculated in terms of chrome oxide and 0.01 to 0.1% by weight of Si calculated in terms of silicon oxide with respect to the weight of 1 mol of the main component are added as subsidiary components.

In this case, x and y preferably satisfy the relations $0.01 \leq x \leq 0.03$ and $0.45 \leq y \leq 0.55$, and $0.03 \leq x \leq 0.05$ and $0.40 \leq y \leq 0.49$, respectively.

In this configuration, the reason why solid solution of at least one of Sb, Nb and Ta is mixed as a third component in lead zirconate titanate as a base ceramic composition is to improve the piezoelectric characteristic of ceramics. With this configuration, the relative dielectric constant $\epsilon$ can be made large and the mechanical quality coefficient Qm can be made small. Accordingly, a piezoelectric ceramic composition adapted for constituting a vibration detecting piezoelectric sensor can be obtained.

Further, the reason for addition of 0.1 to 0.8% by weight of Cr calculated in terms of chrome oxide as a subsidiary component with respect to the weight of 1 mol of the main component is to improve the heat resistance of piezoelectric ceramics to suppress the deterioration of piezoelectric characteristic after the passage of the composition through a reflow furnace. By this, it is possible to obtain a piezoelectric ceramic composition excellent in heat resistance and little in deterioration of piezoelectric characteristic after the passage of the composition through a reflow furnace without great increase of mechanical quality coefficient Qm.

Further, the reason for addition of 0.01 to 0.1% by weight of Si calculated in terms of silicon oxide as a subsidiary component with respect to the weight of 1 mol of the main component is to improve the strength of the piezoelectric element without any change of the aforementioned piezoelectric characteristic. By this, it is possible to obtain a piezoelectric ceramic composition small in mechanical quality coefficient Qm, excellent in heat resistance, little in deterioration of piezoelectric characteristic after the passage of the composition through a reflow furnace and excellent in element strength by about twice as large as the conventional composition.

EXAMPLES

Chemically pure PbO, $TiO_2$, $ZrO_2$, $Sb_2O_5$, $Nb_2O_5$, $Ta_2O_5$, $Cr_2O_3$ and $SiO_2$ were used as starting materials. The starting materials were weighed to form a predetermined composition (Table 1) and wet-mixed in a ball mill. Then, the mixture powder was temporarily baked in air at a temperature in a range of from 850° C. to 950° C. and then wet-pulverized in a ball mill.

Then, an organic binder was added to the thus obtained powder to perform granulation to thereby form a rectangular molding which is 20 mm in length, 20 mm in width and 1.5 mm in thickness under a pressure of 2000 kg/cm². Then, the molding was baked in an air atmosphere at a temperature in a range of from 1160° C. to 1240° C.

The sintered material thus obtained was surface-polished up to a thickness of 1 mm, and then silver-baked to form electrodes. The electrodes were subjected to polarization-process in electrically insulating oil at a temperature in a range of 80° C. to 120° C. in the direction of the thickness under the condition of application of a voltage in a range of from 2 kV/mm to 3 kV/mm for 30 minutes.

After the polarization-process, the element was cut into a size having a length of 12 mm and a width of 3 mm to thereby obtain elements to be evaluated.

The elements to be evaluated thus obtained were applied to an impedance analyzer to measure the electrostatic capacitance C of the elements, resonant frequency fr and antiresonant frequency fa. The relative dielectric constant $\epsilon$ and the electromechanical coupling factor k31 of stretching vibration in a longitudinal direction were calculated on the basis of the measured results. Results obtained in the aforementioned manner are as shown in Table 1.

TABLE 1

| Sample No. | Me | x mol | y mol | $Cr_2O_3$ wt. % | $SiO_2$ wt. % |
|---|---|---|---|---|---|
| *1 | Sb | 0.025 | 0.47 | 0.35 | 0 |
| 2 | Sb | 0.025 | 0.47 | 0.35 | 0.01 |
| 3 | Sb | 0.025 | 0.47 | 0.35 | 0.1 |
| *4 | Sb | 0.025 | 0.47 | 0.35 | 0.12 |
| *5 | — | 0 | 0.51 | 0.35 | 0.05 |
| 6 | Sb | 0.01 | 0.51 | 0.35 | 0.05 |
| 7 | Sb | 0.05 | 0.41 | 0.35 | 0.05 |
| *8 | Sb | 0.06 | 0.41 | 0.35 | 0.05 |
| *9 | Sb | 0.025 | 0.47 | 0 | 0.05 |
| 10 | Sb | 0.025 | 0.47 | 0.1 | 0.05 |
| 11 | Sb | 0.05 | 0.42 | 0.8 | 0.05 |
| *12 | Sb | 0.05 | 0.42 | 1 | 0.05 |
| 13 | Sb | 0.025 | 0.46 | 0.35 | 0.05 |
| 14 | Nb | 0.025 | 0.46 | 0.35 | 0.05 |
| 15 | Ta | 0.025 | 0.46 | 0.35 | 0.05 |
| 16 | Sb Nb | 0.015 0.015 | 0.47 | 0.35 | 0.05 |
| 17 | Sb Ta Nb | 0.015 0.015 0.015 | 0.47 | 0.35 | 0.05 |
| 18 | Ta Sb | 0.015 0.01 | 0.47 | 0.35 | 0.05 |
| 19 | Nb Ta | 0.01 0.01 | 0.47 | 0.35 | 0.05 |
| *20 | Sb | 0.05 | 0.39 | 0.35 | 0.05 |
| 21 | Sb | 0.05 | 0.40 | 0.35 | 0.05 |
| 22 | Sb | 0.01 | 0.55 | 0.35 | 0.05 |
| *23 | Sb | 0.01 | 0.57 | 0.35 | 0.05 |
| 24 | Nb | 0.03 | 0.45 | 0.5 | 0.05 |
| 25 | Nb | 0.035 | 0.49 | 0.3 | 0.05 |

| Sample No. | Electro-mechanical coupling factor (k31) % | Relative di-electric constant ($\epsilon$) | Mechanical quality factor (Qm) | Rate of change of K31 % | Deflective strength ($\sigma$) Kgf/mm² |
|---|---|---|---|---|---|
| *1 | 38.5 | 1500 | 180 | 1.1 | 5.5 |
| 2 | 38.5 | 1450 | 180 | 1.1 | 10.5 |
| 3 | 38.0 | 1400 | 180 | 1.3 | 11.5 |
| *4 | 29.5 | 900 | 210 | 7.6 | 7.5 |
| *5 | 20.5 | 950 | 450 | 1.9 | 9.5 |
| 6 | 36.0 | 1450 | 190 | 1.0 | 11.5 |
| 7 | 35.5 | 1500 | 130 | 1.5 | 11.0 |
| *8 | 32.1 | 1300 | 120 | 2.0 | 6.0 |
| *9 | 36.0 | 1350 | 80 | 11.2 | 11.0 |
| 10 | 38.5 | 1500 | 100 | 1.8 | 11.0 |
| 11 | 35.5 | 1400 | 180 | 1.5 | 10.5 |
| *12 | 34.0 | 1250 | 300 | 7.2 | 6.0 |
| 13 | 39.0 | 1550 | 180 | 1.1 | 11.0 |
| 14 | 38.0 | 1450 | 180 | 0.8 | 11.5 |
| 15 | 38.5 | 1500 | 180 | 1.0 | 11.0 |
| 16 | 38.0 | 1450 | 170 | 1.1 | 11.0 |
| 17 | 38.0 | 1450 | 170 | 1.2 | 11.5 |
| 18 | 37.5 | 1400 | 180 | 1.0 | 12.0 |
| 19 | 38.0 | 1450 | 170 | 1.2 | 11.0 |
| *20 | 29.5 | 1050 | 250 | 7.0 | 10.5 |
| 21 | 35.0 | 1400 | 180 | 1.9 | 11.0 |
| 22 | 35.5 | 1350 | 190 | 1.1 | 11.5 |

TABLE 1-continued

| | | | | | |
|---|---|---|---|---|---|
| *23 | 28.5 | 1000 | 310 | 2.7 | 10.0 |
| 24 | 35.1 | 1300 | 190 | 1.0 | 11.5 |
| 25 | 35.0 | 1250 | 120 | 1.9 | 11.2 |

Incidentally, in the present invention, the mechanical quality coefficient Qm and the electromechanical coupling factor k31 are calculated in the following equation.

$Qm=1/[2\pi fr RC\{1-(fr/fa)2\}$, where R is the resonant resistance, C is the electrostatic capacitance between element electrodes, fr is the resonant frequency, and fa is the antiresonant frequency.

$K31(\%)=\sqrt{[\{(0.405fr)/(fa-fr)\}+0.595]} \times 100$, where fr is the resonant frequency and fa is the antiresonant frequency.

The evaluation of the solder heat resistance of the elements, that is, the evaluation of the deterioration of piezoelectric characteristic after the passage of the elements through a reflow furnace was performed by comparison between the electromechanical coupling factor k31 of stretching vibration in a longitudinal direction before the test of immersing the piezoelectric element in a solder tank at 260° C. for 1 minute and the electromechanical coupling factor k31 after the passage of 24 hours after the test. Results thereof are shown in the column "Rate of Change of k31" in Table 1. The rate of the change of the electromechanical coupling factor k31 of stretching vibration in a longitudinal direction is given by the following expression.

Rate of Change of k31 =[(k31 before Test–k31 after 24 hours)/ (k31 before Test)]×100

Incidentally, it can be the that the heat resistance of the elements becomes better as the rate of the change of k31 decreases.

The evaluation of the strength of the elements was performed by a three-point bending strength testing method as follows. A molding shaped like a rectangle which was 25 mm in length, 25 mm in width and 1.5 mm in thickness in the aforementioned condition was baked under the aforementioned condition. The sintered material thus obtained was surface-polished up to a thickness of 1 mm and then cut into a size of 20 mm×5 mm in length and width. The elements thus obtained were used as test pieces. Then, the maximum breaking load was measured. The deflective strength a calculated on the basis of the maximum breaking load is shown in Table 1.

Incidentally, the sample marked with the symbol * in Table 1 is a comparative sample out of the scope of the present invention.

Further, in a sample containing two or more kinds of Me, the value of x expresses the total amount of Me. The value of x in each of the sample Nos. 16, 17, 18 and 19 expresses the total amount of Me (for example, the value of x in the sample No. 16 is given by x=0.015+0.015=0.03).

The electromechanical coupling factor k31 of stretching vibration in a longitudinal direction, the relative dielectric constant ε, the mechanical quality coefficient Qm, the rate of the change of the electromechanical coupling factor k31 of stretching vibration in a longitudinal direction and the deflective strength a were evaluated on the basis of the measured results.

The evaluation was performed as follows. The electromechanical coupling factor k31 of stretching vibration in a longitudinal direction was regarded as being good when it was not lower than 35%. The relative dielectric constant ε was regarded as being good when it was not smaller than 1200. The mechanical quality coefficient Qm was regarded as being good when it was not larger than 200. The rate of the change of the electromechanical coupling factor k31 of stretching vibration in a longitudinal direction was regarded as being good when it was not higher than 2%. The deflective strength a was regarded as being good when it was not smaller than 10 kgf/mm². Samples in the other conditions were regarded as being bad.

Consequently, it is apparent from Table 1 that sample Nos. 4, 5, 8, 12, 20 and 23 are out of the scope of the present invention with respect to the electromechanical coupling factor k31 of stretching vibration in a longitudinal direction. Sample Nos. 4, 5, 20 and 23 are out of the scope with respect to the relative dielectric constant ε. Sample Nos. 4, 5, 12, 20 and 23 are out of the scope with respect to the mechanical quality coefficient Qm. Sample Nos. 4, 9, 12, 20 and 23 are out of the scope with respect to the rate of the change of the electromechanical coupling factor k31 of stretching vibration in a longitudinal direction. Sample Nos. 1, 4, 5, 8 and 12 are out of the scope with respect to the deflective strength a.

Therefore, sample Nos. 2, 3, 6, 7, 10, 11, 13, 14, 15, 16, 17, 18, 19, 21 and 22 are in the scope of the present invention with respect to all the characteristics.

When the ranges of components of a sample are rearranged on the basis of the aforementioned discrimination, the following ranges of components are regarded as being bad.

with respect to x: x<0.01 or 0.05<x with respect to y: y<0.40 or 0.55<y with respect to $Cr_2O_3$: $Cr_2O_3$<0.1% by weight or 0.8% by weight<$Cr_2O_3$ with respect to $SiO_2$: $SiO_2$<0.01% by weight or 0.1% by weight<$SiO_2$ Accordingly, the following ranges of components are regarded as being good.

with respect to x: $0.01 \leq x \leq 0.05$ with respect to y: $0.40 \leq y \leq 0.55$ with respect to $Cr_2O_3$: 0.1% by weight$\leq Cr_2O_3 \leq$0.8% by weight (In case of $0.01 \leq x \leq 0.03$, it is preferable that 0.1% by weight$\leq Cr_2O_3 \leq$0.5% by weight, and in case of $0.03 < x \leq 0.05$, it is preferable that 0.3% by weight$\leq Cr_2O_3 \leq$0.8% by weight)

with respect to $SiO_2$: 0.01% by weight$\leq SiO_2 \leq$0.1% by weight

Accordingly, with respect to the ranges of components in the present invention, the piezoelectric ceramic composition contains $x(Pb_2Me_2O_7)_{1/2} \cdot (1-x)[Pb(Zr_{1-y}Ti_y)O_3]$ in which x and y are values satisfying the relations $0.01 \leq x \leq 0.05$ and $0.40 \leq y \leq 0.55$, and Me is at least one of Sb, Nb and Ta as a main component, and 0.1 to 0.8% by weight of Cr calculated in terms of chrome oxide and 0.01 to 0.1% by weight of Si calculated in terms of silicon oxide with respect to the weight of 1 mol of the main component are added as subsidiary components.

Figure is a graph for explaining the percentage of defectives caused by cracking or breaking of elements at the time of manufacturing the products. FIG. 1 shows the percentage of defectives caused by cracking or breaking of elements in the case where each of piezoelectric elements for use in vibration detecting piezoelectric sensors is treated into an element thickness of 80 μm.

It is apparent from FIG. 1 that the percentage of defectives caused by cracking or breaking at the time of treatment of elements in the conventional example (sample No. 1) is not smaller than 80% whereas the percentage of defectives caused by cracking or breaking in the sample No. 2 ($\sigma$=10.5 kgf/mm$^2$) or sample No. 18 ($\sigma$=12.0 kgf/mm$^2$) having a strength about twice as large as the conventional sample No. 1 ($\sigma$=5.5 kgf/mm$^2$) can be improved greatly to be not higher than 2%.

The present invention provides the piezoelectric ceramic composition which contains a main component represented by $x(Pb_2Me_2O_7)_{1/2} \cdot (1-x)[Pb(Zr_{1-y}Ti_y)O_3]$ in which x and y are numerical values satisfying the relations $0.01 \leq x \leq 0.05$ and $0.40 \leq y \leq 0.55$, and Me is at least one of Sb, Nb and Ta. In the composition, 0.1 to 0.8% by weight of Cr calculated in terms of chrome oxide and 0.01 to 0.1% by weight of Si calculated in terms of silicon oxide with respect to the weight of 1 mol of the main component are added as subsidiary components. Thus, it is possible to obtain a piezoelectric ceramic composition which is excellent in heat resistance, little in deterioration of piezoelectric characteristic after the passage of the composition through a reflow furnace, small in mechanical quality coefficient (Qm) and large in element strength.

Thus, it is possible to obtain a piezoelectric ceramic composition which is adapted for production of a piezoelectric element for use for constituting a vibration detecting piezoelectric sensor having high sensitivity and free from the bad influence of noise so as to be able to operate stably and in which a thin element can be produced easily without deterioration of piezoelectric characteristic caused by heat at the time of soldering.

What is claimed is:

1. A piezoelectric ceramic composition comprising a component represented by the general formula of $x(Pb_2Me_2O_7)_{1/2} \cdot (1-x)[Pb(Zr_{1-y}Ti_y)O_3]$, in which x and y are numerical values satisfying the relations $0.01 \leq x \leq 0.05$ and $0.40 \leq y \leq 0.55$, and Me is at least one of Sb, Nb and Ta;

0.1 to 0.8% by weight of Cr calculated in terms of chrome oxide with respect to the weight of 1 mol of said component; and 0.01 to 0.1% by weight of Si calculated in terms of silicon oxide with respect to the weight of 1 mol of said component.

2. A piezoelectric ceramic composition according to claim 1, wherein x and y satisfy the relations $0.01 \leq x \leq 0.03$ and $0.45 \leq y \leq 0.55$.

3. A piezoelectric ceramic composition according to claim 1, wherein x and y satisfy the relations $0.03 \leq x \leq 0.05$ and $0.40 \leq y \leq 0.47$.

4. A piezoelectric ceramic composition according to claim 1, wherein said chrome oxide is $Cr_2O_3$.

5. A piezoelectric ceramic composition according to claim 1, wherein said silicon oxide is $SiO_2$.

* * * * *